(12) United States Patent
Yu et al.

(10) Patent No.: US 8,471,598 B2
(45) Date of Patent: Jun. 25, 2013

(54) MAGNETIC LOGIC DEVICE

(75) Inventors: Chwen Yu, Taipei (TW); Kai-Wen Cheng, Hsinchu County (TW); Tien-Wei Chiang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 132 days.

(21) Appl. No.: 13/162,190

(22) Filed: Jun. 16, 2011

(65) Prior Publication Data
US 2012/0319732 A1   Dec. 20, 2012

(51) Int. Cl.
*H03K 19/20* (2006.01)
(52) U.S. Cl.
USPC .......................................... 326/104
(58) Field of Classification Search
None
See application file for complete search history.

(56) References Cited

U.S. PATENT DOCUMENTS

| | | | |
|---|---|---|---|
| 6,914,807 B2* | 7/2005 | Nakamura et al. | 365/158 |
| 2006/0145806 A1* | 7/2006 | Kim et al. | 336/200 |
| 2006/0164124 A1* | 7/2006 | Koch et al. | 326/104 |

OTHER PUBLICATIONS

E.B. Myers et al., "Current-Induced Switching of Domains in Magnetic Multilayer Devices", Science 285, 867 (1999); DOI: 10.1126/science.285.5429.867, Aug. 6, 1999, 5 pages.
Y. Jiang et al., "Spin Transfer in Antisymmetric Exchange-Biased Spin-Valves", Applied Physics Letters 86, 192515 (2005), 3 pages.
A.A. Tulapurkar et al., "Subnanosecond Magnetization Reversal in Magnetic Nanopillars by Spin Angular Momentum Transfer", 2004 American Institute of Physics, Nov. 29, 2004, vol. 85, No. 22, 3 pages.
A.D. Kent et al., "Spin-Transfer-Induced Precessional Magnetization Reversal", 2004 American Institute of Physics, May 10, 2004, vol. 84, No. 19, 3 pages.
Chikako Yoshida et al., "Unipolar Resistive Switching in CoFeB/MgO/CoFeB Magnetic Tunnel Junction", 2008 American Institute of Physics, Allied Physics Letters 92, 113508 (2008), 3 pages.
Manendra Pakala et al., "Critical Current Distribution in Spin-Transfer-Switched Magnetic Tunnel Junctions" 2005 American Institute of Physics, Journal of Applied Physics 98, 056107 (2005), 3 pages.
S. Cardoso et al., "Double-Barrier Magnetic Tunnel Junctions with GeSbTe Thermal Barriers for Improved Thermally Assisted Magnetoresistive Random Access Memory Cells", 2006 American Institute of Physics, Journal of Applied Physics 99, 08N901 (2006), 3 pages.

\* cited by examiner

*Primary Examiner* — Crystal L Hammond
(74) *Attorney, Agent, or Firm* — Haynes and Boone, LLP

(57) ABSTRACT

The present disclosure provides for magnetic logic devices and methods of operating such a device. In one embodiment, the device includes a bottom electrode configured to receive a first input current and a second input current, a bottom magnetic layer disposed over the bottom electrode, a nonmagnetic layer disposed over the bottom magnetic layer, a top magnetic layer disposed over the nonmagnetic layer, and a top electrode disposed over the top magnetic layer, the top electrode and the bottom electrode configured to provide an output voltage which is dependent on the first and second input currents and which follows an AND gate logic or an OR gate logic.

20 Claims, 8 Drawing Sheets

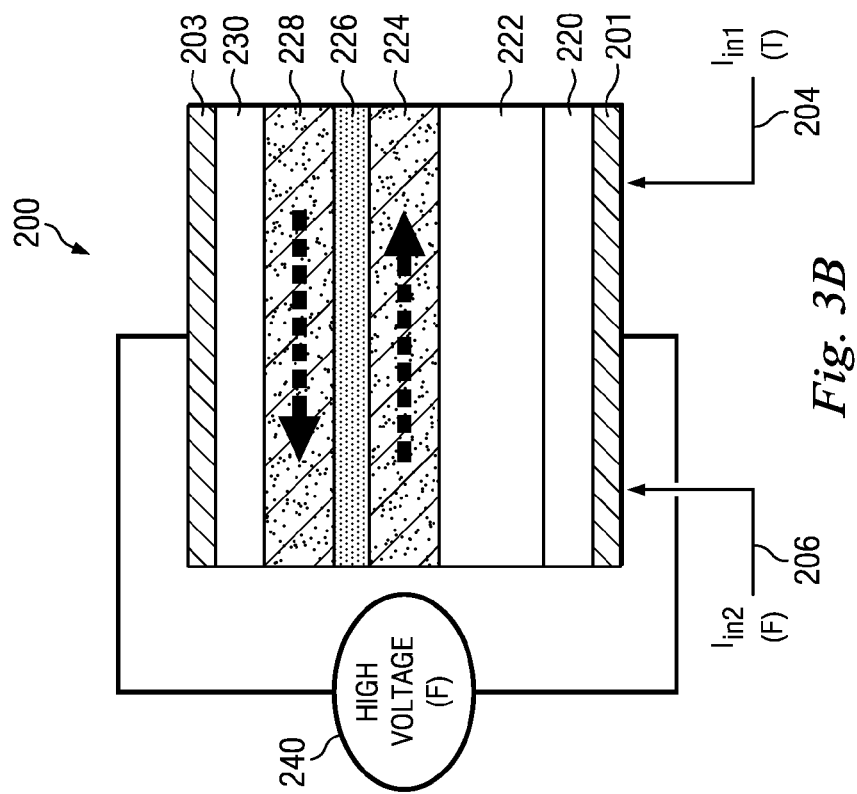
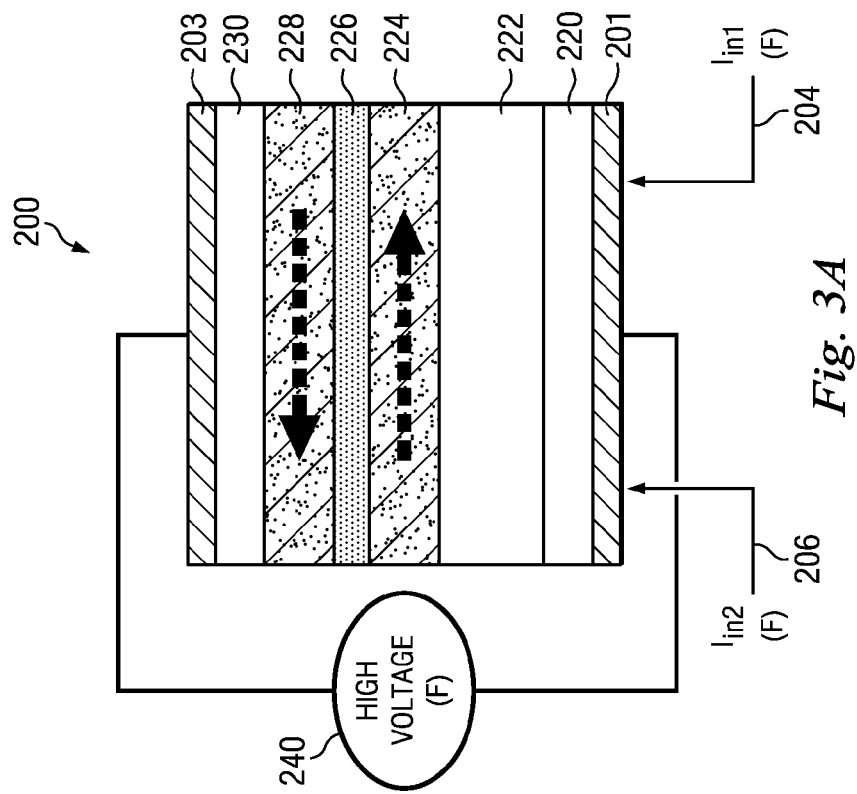

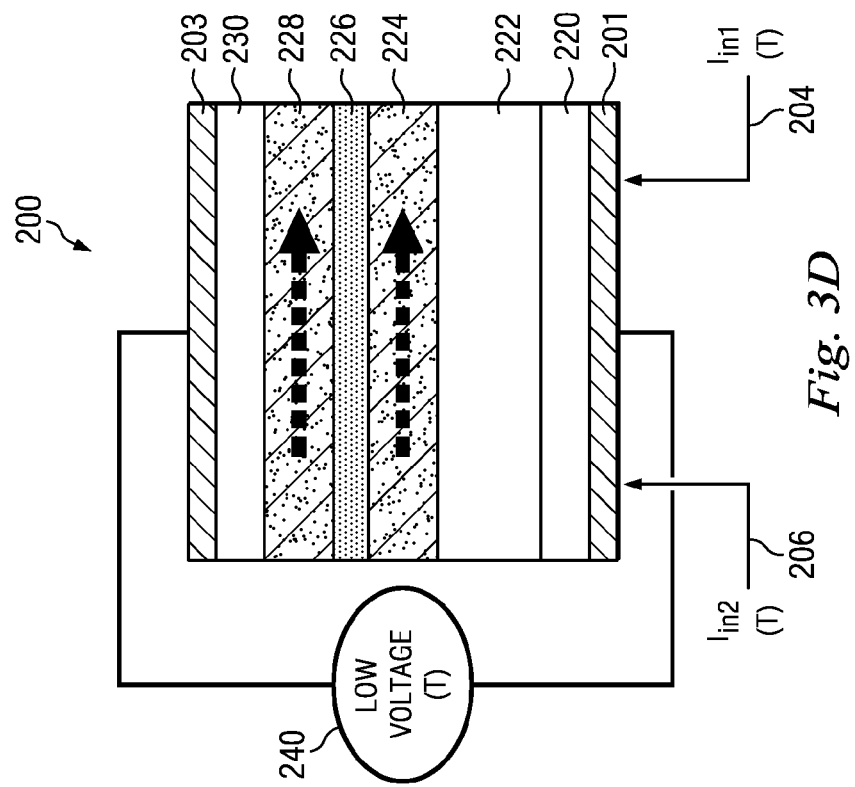
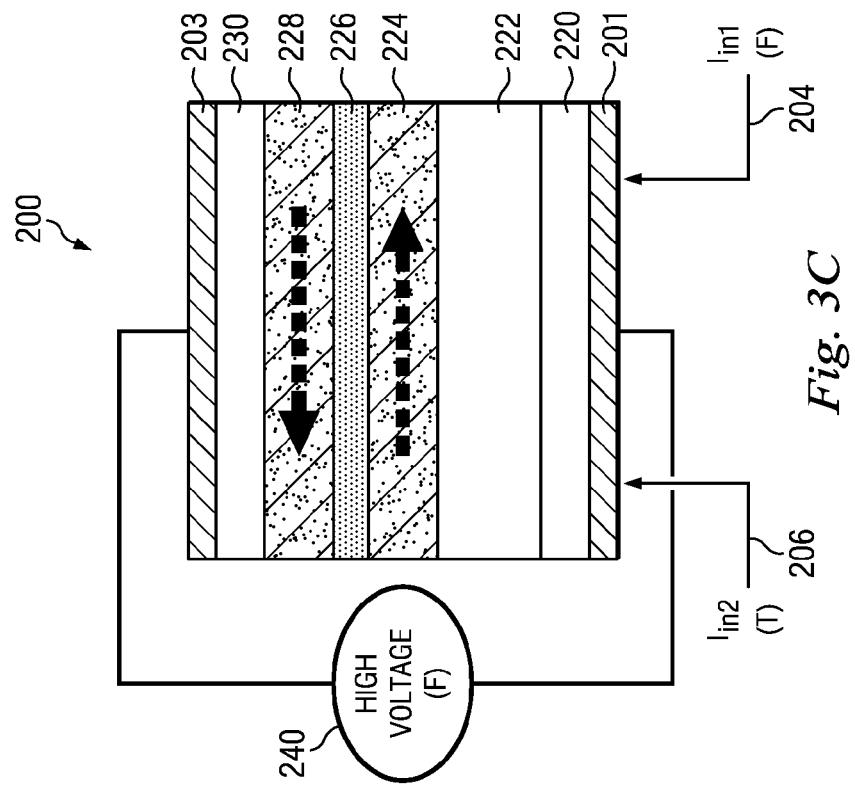

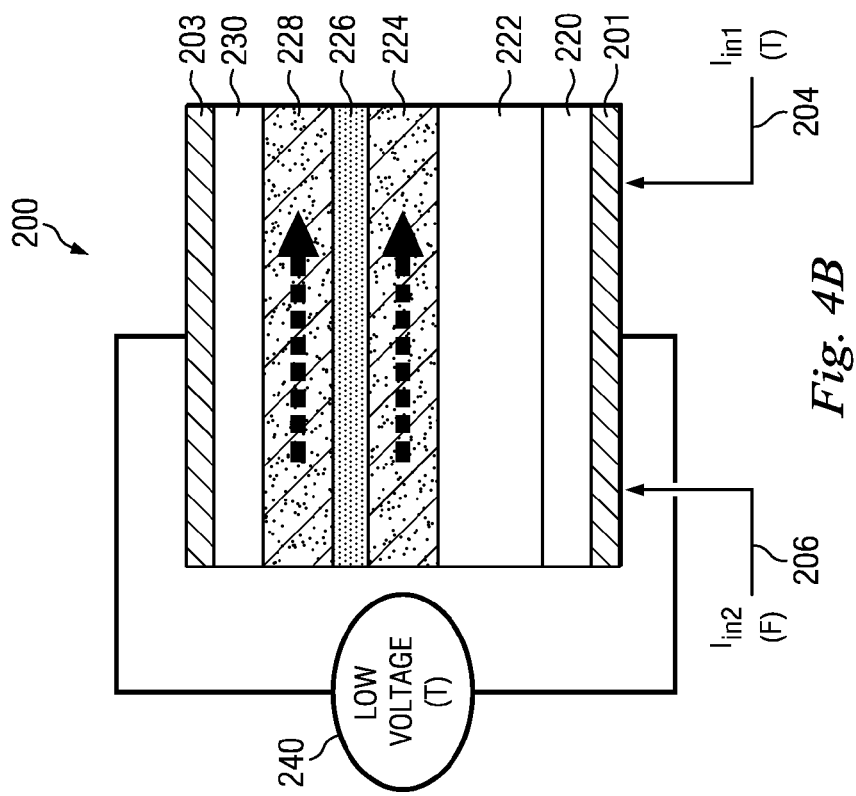
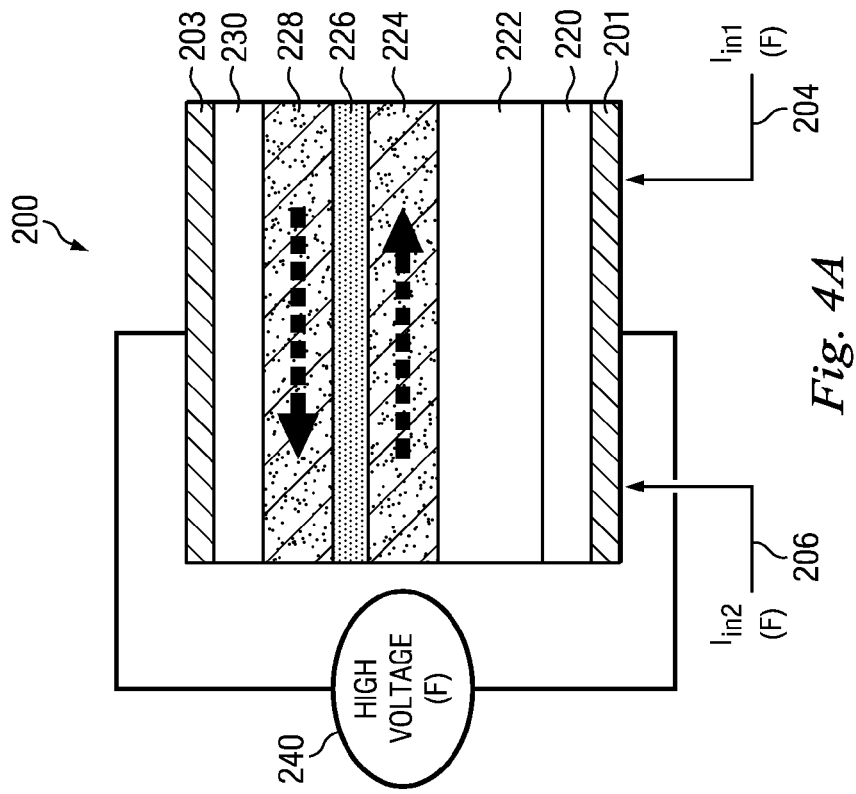

MAGNETIC LOGIC DEVICE

BACKGROUND

Magnetization switching using magnetic fields produced by current lines has been previously used for magnetic information storage or magnetic random access memory (MRAM) technology. More recently, magnetization switching by spin-polarized current (or by a mechanism called spin transfer) has been demonstrated for MRAM technology. However, a magnetic logic gate having improved speed and power consumption is desirable.

SUMMARY

The present disclosure provides for many different embodiments. According to one embodiment, a magnetic logic device is provided. The device includes a bottom electrode configured to receive a first input current and a second input current, a bottom magnetic layer disposed over the bottom electrode, a nonmagnetic layer disposed over the bottom magnetic layer, a top magnetic layer disposed over the nonmagnetic layer, and a top electrode disposed over the top magnetic layer, the top electrode and the bottom electrode configured to provide an output voltage which is dependent on the first and second input currents and which follows an AND gate logic or an OR gate logic.

In another embodiment, a magnetic logic device includes a bottom electrode configured to receive a first input current and a second input current, a bottom buffer layer disposed over the bottom electrode, an antimagnetic layer disposed over the bottom buffer layer, a fixed bottom ferromagnetic layer disposed over the antimagnetic layer, a nonmagnetic layer disposed over the bottom ferromagnetic layer, and a free top ferromagnetic layer disposed over the nonmagnetic layer, wherein an initial magnetization alignment of the bottom and top ferromagnetic layers is antiparallel. The device further includes a top buffer layer disposed over the top ferromagnetic layer, and a top electrode disposed over the top buffer layer, wherein the top electrode is configured to receive a refresh current greater than a critical current required to switch a magnetization direction of the top ferromagnetic layer, and wherein the top electrode and the bottom electrode are configured to provide an output voltage which is dependent on the first and second input currents and which follows an AND gate logic or an OR gate logic.

In yet another embodiment, a method of operating a magnetic logic device includes providing a magnetic logic device having a bottom electrode, a bottom magnetic layer disposed over the bottom electrode, a nonmagnetic layer disposed over the bottom magnetic layer, a top magnetic layer disposed over the nonmagnetic layer, and a top electrode disposed over the top magnetic layer. The method further includes applying a first input current and a second input current to the bottom electrode, and providing an output voltage between the top electrode and the bottom electrode which is dependent on the first and second input currents and which follows an AND gate logic or an OR gate logic.

BRIEF DESCRIPTION OF THE DRAWINGS

Aspects of the present disclosure are understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

FIGS. 3A-3D illustrate an AND gate logic in accordance with an embodiment of the present disclosure.

FIGS. 4A-4D illustrate an OR gate logic in accordance with an embodiment of the present disclosure.

DETAILED DESCRIPTION

Figure 1:
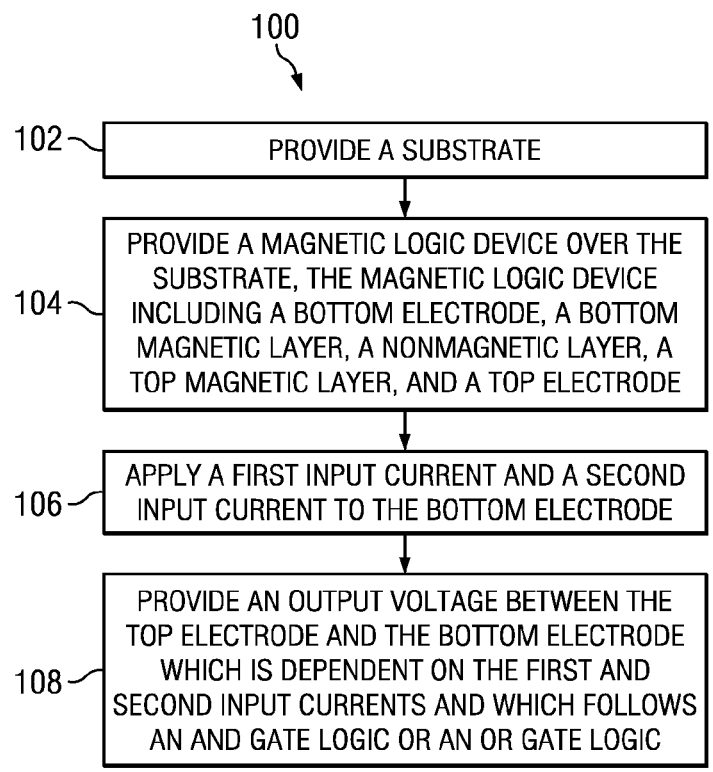
FIG. 1 is a flowchart of a method of operating a magnetic logic device in accordance with an embodiment of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top", may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" sides of the other elements. The term "lower", can therefore, encompass both an orientation of "lower" and "upper", depending on the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers, portions, and/or sections, these regions, layers, portions, and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Referring now to FIG. 1, a flowchart is shown illustrating a method 100 for operating a magnetic logic device in accordance with an embodiment of the present disclosure. At block 102, a substrate is provided. At block 104, a magnetic logic device is provided, the magnetic logic device including a bottom electrode, a bottom magnetic layer disposed over the bottom electrode, a nonmagnetic layer disposed over the bottom magnetic layer, a top magnetic layer disposed over the nonmagnetic layer, and a top electrode disposed over the top magnetic layer. At block 106, a first input current and a second input current are applied to the bottom electrode. At block 108, an output voltage between the top electrode and the bottom electrode is provided. The output voltage is dependent on the first and second input currents and follows an AND gate logic or an OR gate logic. In one example, the input currents may include either positive or negative currents and the output voltage may include either positive or negative voltages.

The various structures in method 100 described above may be formed by various applicable techniques, such as deposition, pattern, and/or etch techniques. In one embodiment, the magnetic logic device may include a magnetic tunnel junction (MTJ) device when the nonmagnetic layer is an insulator layer, such as a nonmagnetic layer comprised of an oxide. In another embodiment, the magnetic logic device may include a spin valve device when the nonmagnetic layer is a metal layer, such as a nonmagnetic layer comprised of copper.

It should be noted that the operations of method 100 may be rearranged or otherwise modified within the scope of the various aspects. It is further noted that additional processes may be provided before, during, and after method 100 of FIG. 1, and that some other processes may only be briefly described herein. Thus, other implementations are possible within the scope of the various aspects described herein.

According to one aspect, method 100 may further include that an initial magnetization alignment of the bottom and top magnetic layers is antiparallel.

According to another aspect, when an initial magnetization alignment of the bottom and top magnetic layers is antiparallel, method 100 may further include that the AND gate logic comprises: the output voltage is a first binary level when the first and second input currents are each 0 or less than half a critical current required to switch a magnetization direction of the top magnetic layer, and when the magnetization alignment of the bottom and top ferromagnetic layers is antiparallel; the output voltage is a first binary level when the first input current is between the critical current and half the critical current, when the second input current is 0 or less than half the critical current, and when the magnetization alignment of the bottom and top ferromagnetic layers is antiparallel; the output voltage is a first binary level when the first input current is 0 or less than half the critical current, when the second input current is between the critical current and half the critical current, and when the magnetization alignment of the bottom and top ferromagnetic layers is antiparallel; and the output voltage is a second binary level when the first and second input currents are each between the critical current and half the critical current, and when the magnetization alignment of the bottom and top ferromagnetic layers is parallel.

According to yet another aspect, when an initial magnetization alignment of the bottom and top magnetic layers is antiparallel, method 100 may further include that the OR gate logic comprises: the output voltage is a first binary level when the first and second input currents are each 0 or less than a critical current required to switch a magnetization direction of the top magnetic layer, and when the magnetization alignment of the bottom and top ferromagnetic layers is antiparallel; the output voltage is a second binary level when the first input current is greater than the critical current, when the second input current is 0 or less than the critical current, and when the magnetization alignment of the bottom and top ferromagnetic layers is parallel; the output voltage is a second binary level when the first input current is 0 or less than the critical current, when the second input current is greater than the critical current, and when the magnetization alignment of the bottom and top ferromagnetic layers is parallel; and the output voltage is a second binary level when the first and second input currents are each greater than the critical current, and when the magnetization alignment of the bottom and top ferromagnetic layers is parallel.

According to yet another aspect, method 100 may further include applying a refresh current to the top electrode, the refresh current being greater than a critical current required to switch the magnetization direction of the top magnetic layer, and the refresh current causing the magnetization alignment of the bottom and top magnetic layers to be an initial state of antiparallel.

Figure 2B:
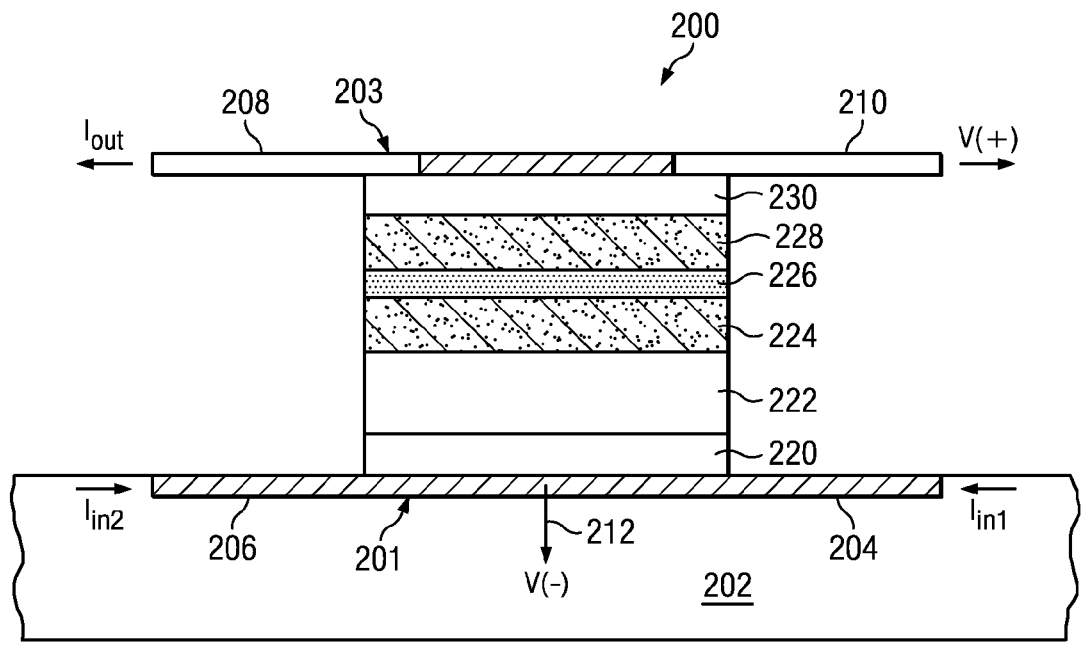
FIGS. 2A and 2B is a perspective view and a cross-sectional view, respectively, of a magnetic logic device in accordance with an embodiment of the present disclosure.
Figure 2A:
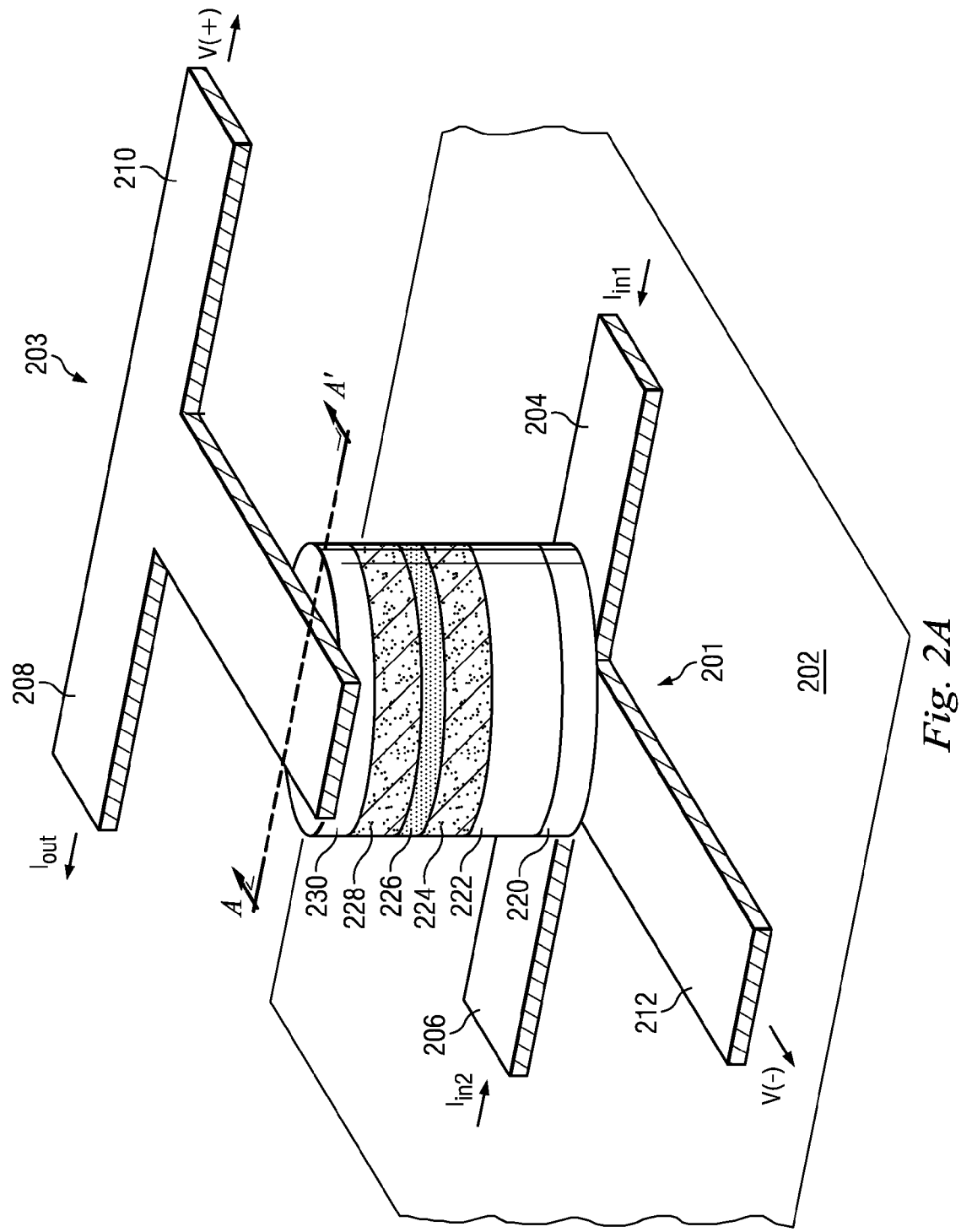

Referring now to FIGS. 2A and 2B, FIG. 2A illustrates a perspective view of a magnetic logic device 200 in accordance with an embodiment of the present disclosure, and FIG. 2B illustrates a cross-sectional view of magnetic logic device 200 along a line A-A' in FIG. 2A in accordance with an embodiment of the present disclosure.

Magnetic logic device 200 includes, in one example, a bottom electrode 201 configured to receive a first input current and a second input current (e.g., shown by inbound arrows $I_{in1}$ and $I_{in2}$), a bottom magnetic layer 224 disposed over the bottom electrode 201, a nonmagnetic layer 226 disposed over the bottom magnetic layer 224, a top magnetic layer 228 disposed over the nonmagnetic layer 226, and a top electrode 203 disposed over the top magnetic layer 228. The top electrode 203 and the bottom electrode 201 are configured to provide an output voltage (e.g., shown by outbound arrows V(+) and V(−)) which is dependent on the first and second input currents and which follows an AND gate logic or an OR gate logic.

Device 200 may further include a bottom buffer layer 220 disposed over the bottom electrode 201, an antimagnetic layer 222 disposed over the bottom buffer layer 220, and a top buffer layer 230 disposed between the top magnetic layer 228 and the top electrode 203.

In one example, the bottom electrode 201 is comprised of a nonmagnetic metal or alloy (e.g., Al or Ti or alloys thereof), the bottom buffer layer 220 is comprised of a metal or insulator and has a thickness between about 10 nm and about 20 nm, the antimagnetic layer 222 is comprised of an antiferromagnetic material and has a thickness between about 100 nm and about 200 nm, the bottom magnetic layer 224 is comprised of ferromagnetic metal or alloy (e.g., CoFeB or NiFe) and has a thickness between about 40 nm and about 80 nm, the nonmagnetic layer 226 is comprised of either a metal or alloy (for the case of a spin valve device) or insulator material (e.g., an oxide such as MgO, NiO, TiO, or AlO) (for the case of a magnetic tunnel junction device) and has a thickness between about 8 nm and about 30 nm, the top magnetic layer 228 is comprised of ferromagnetic metal or alloy (e.g., CoFeB or NiFe) and has a thickness between about 40 nm and about 80 nm, the top buffer layer 230 is comprised of a metal or insulator and has a thickness between about 5 nm and about 15 nm, and the top electrode 203 is comprised of a nonmagnetic metal or alloy (e.g., Al or Ti or alloys thereof).

In another example, the bottom and top magnetic layers 224, 228 may each be comprised of a single ferromagnetic metal or alloy layer, or the layers 224, 228 may each be comprised of multiple layers. In one example, the layers 224, 228 may each be comprised of a thick ferromagnetic metal or alloy layer having a thickness between about 20 nm and about 40 nm, a metal layer having a thickness between about 8 nm and about 15 nm, and a thin ferromagnetic metal or alloy layer having a thickness between about 10 nm and about 25 nm. In one example, the bottom magnetic layer 224 has a thickness greater than top magnetic layer 228, and the top magnetic layer 228 has a thickness smaller than bottom magnetic layer 224.

According to one aspect, bottom electrode 201 is disposed over a substrate 202, which may include bottom electrode 201 disposed over a surface of substrate 202 and/or embedded within and exposed from substrate 202. In one example, bottom electrode 201 includes a first input current lead 204 for receiving a first input current $I_{in1}$, a second input current lead 206 for receiving a second input current $I_{in2}$, and a bottom voltage lead 212. Other applicable configurations of the leads for bottom electrode 201 are within the scope of the present disclosure.

In one aspect, the first and second input currents may be provided by one or more current sources providing AC or DC current pulses in one example, but may include any of various current sources for providing current. In one example, a current source may further include a power supply regulator and/or a diode bridge. In another example, a current source may provide a current greater than or less than a critical current required to switch the magnetization direction of the top magnetic layer 228.

In one aspect, substrate 202 may include various semiconductor devices, and/or other suitable active and/or passive devices. Example semiconductor devices include integrated circuits including a metal-insulator-semiconductor field effect transistor (MOSFET) including complementary MOSFET (CMOS) features, CIS, and/or other suitable active and/or passive devices. In an embodiment, the substrate may include an integrated circuit (or portion thereof) designed and formed using a CMOS-based process. A substrate having a device (e.g., integrated circuit) formed by other semiconductor fabrication technologies is also within the scope of the described method.

In one embodiment, substrate 202 may include a semiconductor substrate, and may be comprised of silicon, or alternatively may include silicon germanium, gallium arsenic, or other suitable semiconductor materials. The substrate may further include doped active regions and other features such as a buried layer, and/or an epitaxy layer. Furthermore, the substrate may be a semiconductor on insulator such as silicon on insulator (SOI). In other embodiments, the semiconductor substrate may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET). The semiconductor substrate may include underlying layers, devices, junctions, and other features (not shown) formed during prior process steps or which may be formed during subsequent process steps.

In one example, the bottom buffer layer 220 disposed over bottom electrode 201 is comprised of a nonmagnetic metal or alloy (e.g., aluminum or titanium) and has a thickness between about 10 nm and about 20 nm.

In one example, the antimagnetic layer 222 disposed over bottom buffer layer 220 is comprised of an antiferromagnetic material and has a thickness between about 100 nm and about 200 nm. Antimagnetic layer 222 may be exchange-coupled to bottom magnetic layer 224 to pin or fix the magnetization direction of bottom magnetic layer 224. However, antimagnetic layer 222 may be optional as bottom magnetic layer 224 may have its magnetization direction pinned or fixed by virtue of being fabricated with a greater thickness in one example.

In one example, the bottom magnetic layer 224 disposed over antimagnetic layer 222 is comprised of ferromagnetic metal or alloy (e.g., CoFeB or NiFe) and has a thickness between about 40 nm and about 80 nm. In another example, bottom magnetic layer 224 is a bottom ferromagnetic layer comprised of CoFeB. As noted above, in this embodiment, bottom magnetic layer 224 has a magnetization direction which is pinned or fixed by virtue of being fabricated with a greater thickness or by being exchange coupled with an antimagnetic layer.

In another example, the bottom magnetic layer 224 may be comprised of a single ferromagnetic metal or alloy layer, or the layer 224 may be comprised of multiple layers. In one example, the layer 224 may be comprised of a thick ferromagnetic metal or alloy layer having a thickness between about 20 nm and about 40 nm, a metal layer having a thickness between about 8 nm and about 15 nm, and a thin ferromagnetic metal or alloy layer having a thickness between about 10 nm and about 25 nm. In one example, the bottom magnetic layer 224 has a thickness greater than top magnetic layer 228.

In one example, the nonmagnetic layer 226 (which may also be referenced as a spacer layer) disposed over bottom magnetic layer 224 is comprised of either a metal or alloy (for the case of a spin valve device) or insulator material (e.g., an oxide such as MgO, NiO, TiO, or AlO) (for the case of a magnetic tunnel junction device) and has a thickness between about 8 nm and about 30 nm.

In one example, the top magnetic layer 228 disposed over nonmagnetic layer 226 is comprised of ferromagnetic metal or alloy (e.g., CoFeB, or NiFe) and has a thickness between about 40 nm and about 80 nm. In another example, top magnetic layer 228 is a top ferromagnetic layer comprised of CoFeB. Top magnetic layer 228, in this embodiment, has a magnetization direction which is free to be switched by a spin transfer process when device 200 receives a critical current required to switch the magnetization direction of the top magnetic layer.

In another example, the top magnetic layer 228 may be comprised of a single ferromagnetic metal or alloy layer, or the layer 228 may be comprised of multiple layers. In one example, the layer 228 may be comprised of a thick ferromagnetic metal or alloy layer having a thickness between about 20 nm and about 40 nm, a metal layer having a thickness between about 8 nm and about 15 nm, and a thin ferromagnetic metal or alloy layer having a thickness between about 10 nm and about 25 nm. In one example, the top magnetic layer 228 has a thickness smaller than bottom magnetic layer 224.

In one example, the top buffer layer 230 disposed over top magnetic layer 228 is comprised of a metal or insulator and has a thickness between about 5 nm and about 15 nm.

In one example, the top electrode 203 is comprised of a nonmagnetic metal such as aluminum or titanium or alloys thereof. In one example, top electrode 203 includes an output current lead 208 for passing an output current $I_{out}$ (e.g., shown by outbound arrow $I_{out}$) and a top voltage lead 210. Other applicable configurations of the leads for top electrode 203 are within the scope of the present disclosure. In yet another example, top electrode 203 may be configured to receive a refresh current greater than the critical current to place the magnetization alignment of the top and bottom magnetic layers to an initial state.

FIG. 2B illustrates a cross-sectional view of magnetic logic device 200 along a line A-A' in FIG. 2A in accordance with an embodiment of the present disclosure. Leads 204, 206, 208, 210, and 212 along with corresponding currents or voltages are schematically illustrated by inbound and outbound arrows.

The various structures of device 200 described above may be formed by various applicable techniques, such as deposition, pattern, and/or etch techniques. In one example, sputtering, deposition, e-beam lithography, and ion milling techniques may be used. Layers 220, 222, 224, 226, 228, and 230 may each be fabricated into elliptical or oval shapes to form an elliptical or oval shaped pillar.

As noted above, top magnetic layer 228, in this embodiment, has a magnetization direction which is free to be switched by a spin transfer process. For example, input currents are received through bottom electrode 201 and pass in a perpendicular direction through a plane of bottom and top magnetic layers 224, 226 to top electrode 203. Bottom magnetic layer 224 polarizes the spin of the electrons that are transmitted through the layer, and this flow of incoming spins transfers the transverse part of the spin angular momentum to the local magnetization of the top magnetic layer 228. When the currents are sufficiently large, they pump a precessional motion of the top magnetic layer 228 magnetization, which can be switched to either parallel or antiparallel to the bottom magnetic layer 224 magnetization, depending on the magnitude and polarity of the currents. Thus, a magnetization alignment of the bottom and top magnetic layers may be parallel or antiparallel (e.g., as shown in FIGS. 3A-3D, 4A-4D, and 5A-5B by arrows in layers 224 and 228 which point in a common direction (parallel) or opposite directions (antiparallel)).

Accordingly, a voltage output between bottom and top electrodes 201, 203 is dependent upon the input currents $I_{in1}$ and $I_{in2}$ to the bottom electrode 201 and the magnetization alignment of the bottom and top magnetic layers 224, 228, which then affects the magnetoresistance of the nonmagnetic layer 226 between the bottom and top magnetic layers 224, 228 and thus the output voltage from device 200. When a magnetization alignment of the bottom and top magnetic layers is antiparallel, the magnetoresistance of the nonmagnetic layer is large, resulting in a high output voltage. When a magnetization alignment of the bottom and top magnetic layers is parallel, the magnetoresistance of the nonmagnetic layer is small, resulting in a low output voltage. In accordance with one aspect of the present disclosure, the output voltage between bottom and top electrodes 201, 203 (e.g., output voltage 240 of FIGS. 3A-3D, 4A-4D) follows an AND gate logic or an OR gate logic. In one example, the input currents may include either positive or negative currents and the output voltage may include either positive or negative voltages.

Referring now to FIGS. 3A-3D, 4A-4D, and 5A-5B, an AND gate logic, an OR gate logic, and a refresh process for device 200 are illustrated, respectively, in accordance with an embodiment of the present disclosure.

FIGS. 3A-3D illustrate an AND gate logic in accordance with an embodiment of the present disclosure. In one embodiment, an initial state of the magnetization alignment of the bottom and top magnetic layers 224, 228 is antiparallel. A false state for an input current $I_{in1}$, $I_{in2}$ is 0 or less than half a critical current $I_c$ required to switch the magnetization direction of the top magnetic layer 228, and a true state for an input current $I_{in1}$, $I_{in2}$ is between the critical current and half the critical current. A false state for the voltage output 240 is a first binary value of 0 or a high voltage, and a true state for the voltage output 240 is a second binary value of 1 or a low voltage. In other embodiments, true and false states as described above may be reversed from one another without departing from the scope of the present disclosure.

FIG. 3A illustrates the case when the first and second input currents $I_{in1}$, $I_{in2}$ are each 0 or less than half a critical current $I_c$ required to switch the magnetization direction of the top magnetic layer 228, and when the magnetization alignment of the bottom and top magnetic layers 224, 228 is antiparallel. In this case, output voltage 240 is a first binary level or a high voltage. In other terms, the input currents may each be a false state or binary value of 0 and the output voltage may be a false state or a binary value of 0.

FIG. 3B illustrates the case when the first input current $I_{in1}$ is between a critical current required to switch the magnetization direction of the top magnetic layer and half the critical current, when the second input current $I_{in2}$ is 0 or less than half the critical current, and when the magnetization alignment of the bottom and top magnetic layers 224, 228 is antiparallel. In this case, output voltage 240 is a first binary level or a high voltage. In other terms, the first input current $I_{in1}$ may be a true state or binary value of 1, the second input current $I_{in2}$ may be a false state or a binary value of 0, and the output voltage may be a false state or a binary value of 0.

FIG. 3C illustrates the case when the first input current $I_{in1}$ is 0 or less than half a critical current required to switch the magnetization direction of the top magnetic layer, when the second input current $I_{in2}$ is between the critical current and half the critical current, and when the magnetization alignment of the bottom and top magnetic layers 224, 228 is antiparallel. In this case, output voltage 240 is a first binary level or a high voltage. In other terms, the first input current $I_{in1}$ may be a false state or binary value of 0, the second input current $I_{in2}$ may be a true state or a binary value of 1, and the output voltage may be a false state or a binary value of 0.

FIG. 3D illustrates the case when the first and second input currents $I_{in1}$, $I_{in2}$ are each between a critical current required to switch the magnetization direction of the top magnetic layer and half the critical current, and when the magnetization alignment of the bottom and top magnetic layers 224, 228 is parallel. In this case, output voltage 240 is a second binary level or a low voltage. In other terms, the input currents may each be a true state or binary value of 1 and the output voltage may be a true state or a binary value of 1.

Thus, in one embodiment, the AND gate logic of device 200 comprises: the output voltage is a first binary level when the first and second input currents are each 0 or less than half the critical current, and when the magnetization alignment of the bottom and top ferromagnetic layers is antiparallel; the output voltage is a first binary level when the first input current is between the critical current and half the critical current, when the second input current is 0 or less than half the critical current, and when the magnetization alignment of the bottom and top ferromagnetic layers is antiparallel; the output voltage is a first binary level when the first input current is 0 or less than half the critical current, when the second input current is between the critical current and half the critical current, and when the magnetization alignment of the bottom and top ferromagnetic layers is antiparallel; and the output voltage is a second binary level when the first and second input currents are each between the critical current and half the critical current, and when the magnetization alignment of the bottom and top ferromagnetic layers is parallel.

In one example, critical current L may be equal to about 10 mA to reverse the magnetization direction of the free magnetic layer 228 from antiparallel to parallel, a false input current may be about 0 mA, and a true input current may be about 7 mA. An initial magnetization alignment is antiparallel, a false output is from antiparallel magnetization alignment, and a true output is from parallel magnetization alignment.

Thus, the output voltage 240 from device 200 may follow an AND gate logic according to Table 1 below.

TABLE 1

| Input Current 1 | Input Current 2 | Output Voltage |
|---|---|---|
| False or 0 ($I = 0$ or $I < I_c/2$) (e.g., 0 mA) | False or 0 ($I = 0$ or $I < I_c/2$) (e.g., 0 mA) | False or 0 (High) |
| True or 1 ($I_c/2 < I < I_c$) (e.g., 7 mA) | False or 0 ($I = 0$ or $I < I_c/2$) (e.g., 0 mA) | False or 0 (High) |
| False or 0 ($I = 0$ or $I < I_c/2$) (e.g., 0 mA) | True or 1 ($I_c/2 < I < I_c$) (e.g., 7 mA) | False or 0 (High) |
| True or 1 ($I_c/2 < I < I_c$) (e.g., 7 mA) | True or 1 ($I_c/2 < I < I_c$) (e.g., 7 mA) | True or 1 (Low) |

A false output (0) results if either input is false. A true output (1) results only if both input currents to the logic device 200 are true inputs (1). The AND logic also effectively finds the minimum between two binary digits, and thus the output is 0 except when the inputs are each 1.

FIGS. 4A-4D illustrate an OR gate logic in accordance with an embodiment of the present disclosure. In one embodiment, an initial state of the magnetization alignment of the bottom and top magnetic layers 224, 228 is antiparallel, a false output is from antiparallel magnetization alignment, and a true output is from parallel magnetization alignment. A false state for an input current $I_{in1}$, $I_{in2}$ is 0 or less than a critical current $I_c$ required to switch the magnetization direction of the top magnetic layer 228, and a true state for an input current $I_{in1}$, $I_{in2}$ is greater than the critical current. A false state for the voltage output 240 is a first binary value of 0 or a high voltage, and a true state for the voltage output 240 is a second binary value of 1 or a low voltage. In other embodiments, true and false states as described above may be reversed from one another without departing from the scope of the present disclosure.

FIG. 4A illustrates the case when the first and second input currents $I_{in1}$, $I_{in2}$ are each 0 or less than a critical current $I_c$ required to switch the magnetization direction of the top magnetic layer 228, and when the magnetization alignment of the bottom and top magnetic layers 224, 228 is antiparallel. In this case, output voltage 240 is a first binary level or a high voltage. In other terms, the input currents may each be a false state or binary value of 0 and the output voltage may be a false state or a binary value of 0.

FIG. 4B illustrates the case when the first input current $I_{in1}$ is greater than a critical current required to switch the magnetization direction of the top magnetic layer, when the second input current $I_{in2}$ is 0 or less than the critical current, and when the magnetization alignment of the bottom and top magnetic layers is parallel. In this case, output voltage 240 is a second binary level or a low voltage. In other terms, the first input current $I_{in1}$ may be a true state or binary value of 1, the second input current $I_{in2}$ may be a false state or a binary value of 0, and the output voltage may be a true state or a binary value of 1.

Figure 4C:
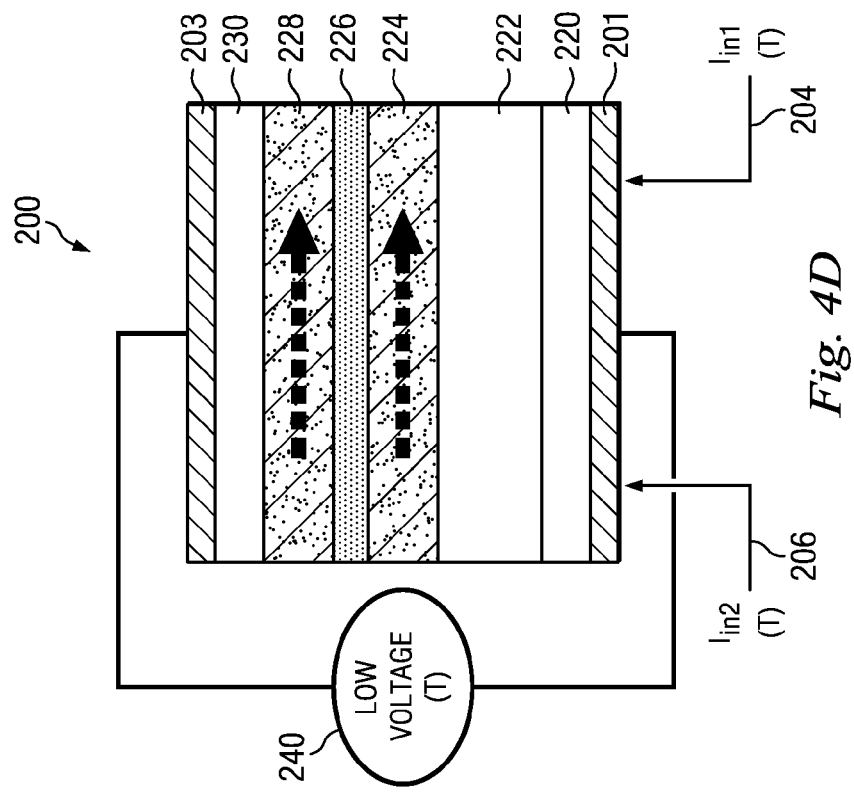

FIG. 4C illustrates the case when the first input current $I_{in1}$ is 0 or less than a critical current required to switch the magnetization direction of the top magnetic layer, when the second input current $I_{in2}$ is greater than the critical current, and when the magnetization alignment of the bottom and top magnetic layers is parallel. In this case, output voltage 240 is a second binary level or a low voltage. In other terms, the first input current $I_{in1}$ may be a false state or binary value of 0, the second input current $I_{in2}$ may be a true state or a binary value of 1, and the output voltage may be a true state or a binary value of 1.

Figure 4D:
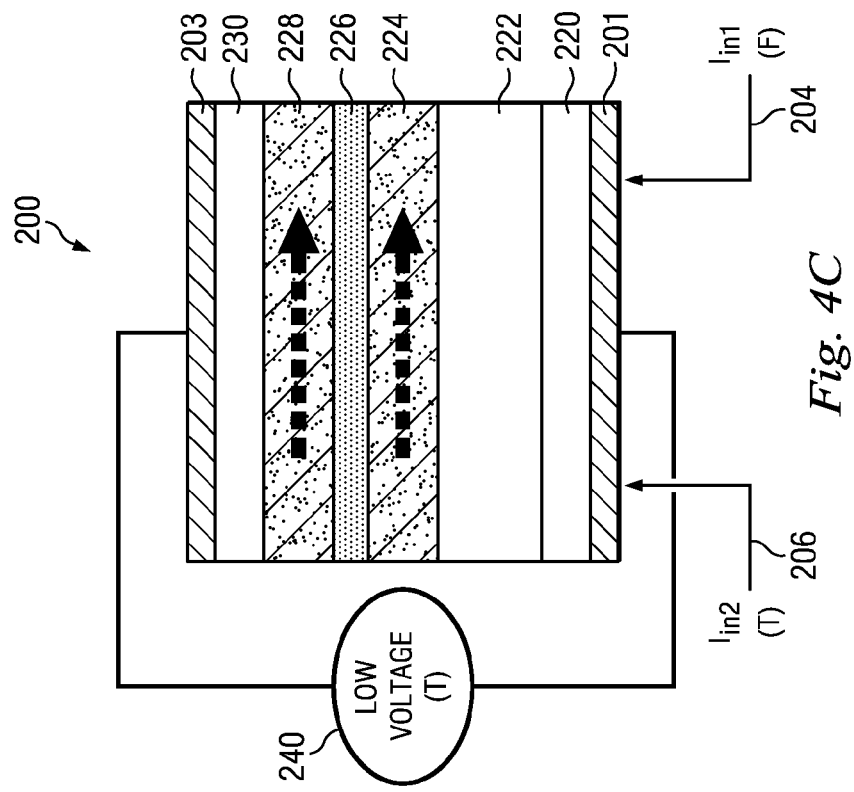

FIG. 4D illustrates the case when the first and second input currents $I_{in1}$, $I_{in2}$ are each greater than a critical current required to switch the magnetization direction of the top magnetic layer, and when the magnetization alignment of the bottom and top magnetic layers is parallel. In this case, output voltage 240 is a second binary level or a low voltage. In other terms, the input currents may each be a true state or binary value of 1 and the output voltage may be a true state or a binary value of 1.

Thus, in one embodiment, the OR gate logic of device 200 comprises: the output voltage is a first binary level when the first and second input currents are each 0 or less than the critical current, and when the magnetization alignment of the bottom and top ferromagnetic layers is antiparallel; the output voltage is a second binary level when the first input current is greater than the critical current, when the second input current is 0 or less than the critical current, and when the magnetization alignment of the bottom and top ferromagnetic layers is parallel; the output voltage is a second binary level when the first input current is 0 or less than the critical current, when the second input current is greater than the critical current, and when the magnetization alignment of the bottom and top ferromagnetic layers is parallel; and the output voltage is a second binary level when the first and second input currents are each greater than the critical current, and when the magnetization alignment of the bottom and top ferromagnetic layers is parallel.

Thus, the output voltage 240 from device 200 may follow an OR gate logic according to Table 2 below.

TABLE 2

| Input Current 1 | Input Current 2 | Output Voltage |
|---|---|---|
| False or 0 ($I = 0$ or $I < I_c$) | False or 0 ($I = 0$ or $I < I_c$) | False or 0 (High) |
| True or 1 ($I > I_c$) | False or 0 ($I = 0$ or $I < I_c$) | True or 1 (Low) |
| False or 0 ($I = 0$ or $I < I_c$) | True or 1 ($I > I_c$) | True or 1 (Low) |
| True or 1 ($I > I_c$) | True or 1 ($I > I_c$) | True or 1 (Low) |

A true output (1) results if either input is true. A false output (0) results only if both input currents to the logic device 200 are false inputs (0). The OR logic also effectively finds the maximum between two binary digits, and thus the output is 1 except when the inputs are each 0.

Figure 5A:
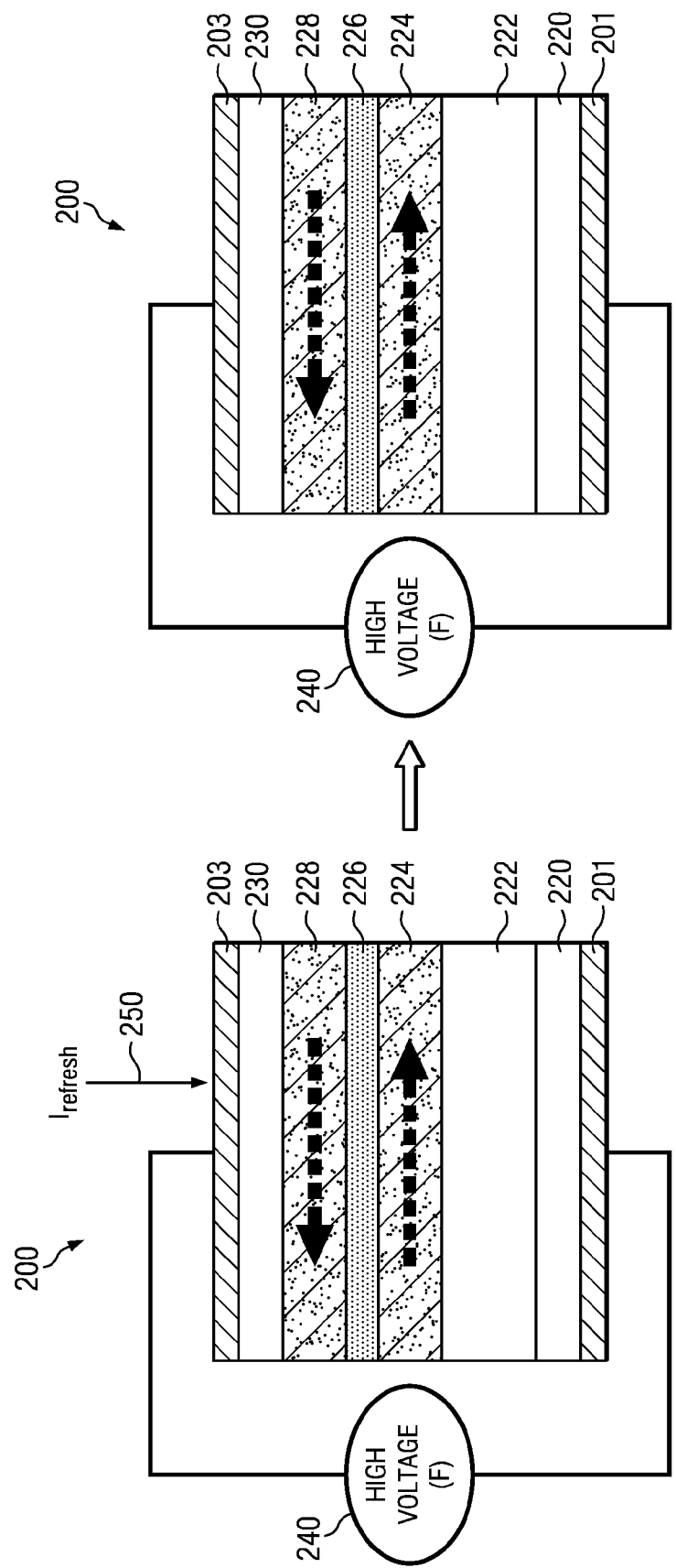
FIGS. 5A and 5B illustrate a refresh process in accordance with an embodiment of the present disclosure.
Figure 5B:
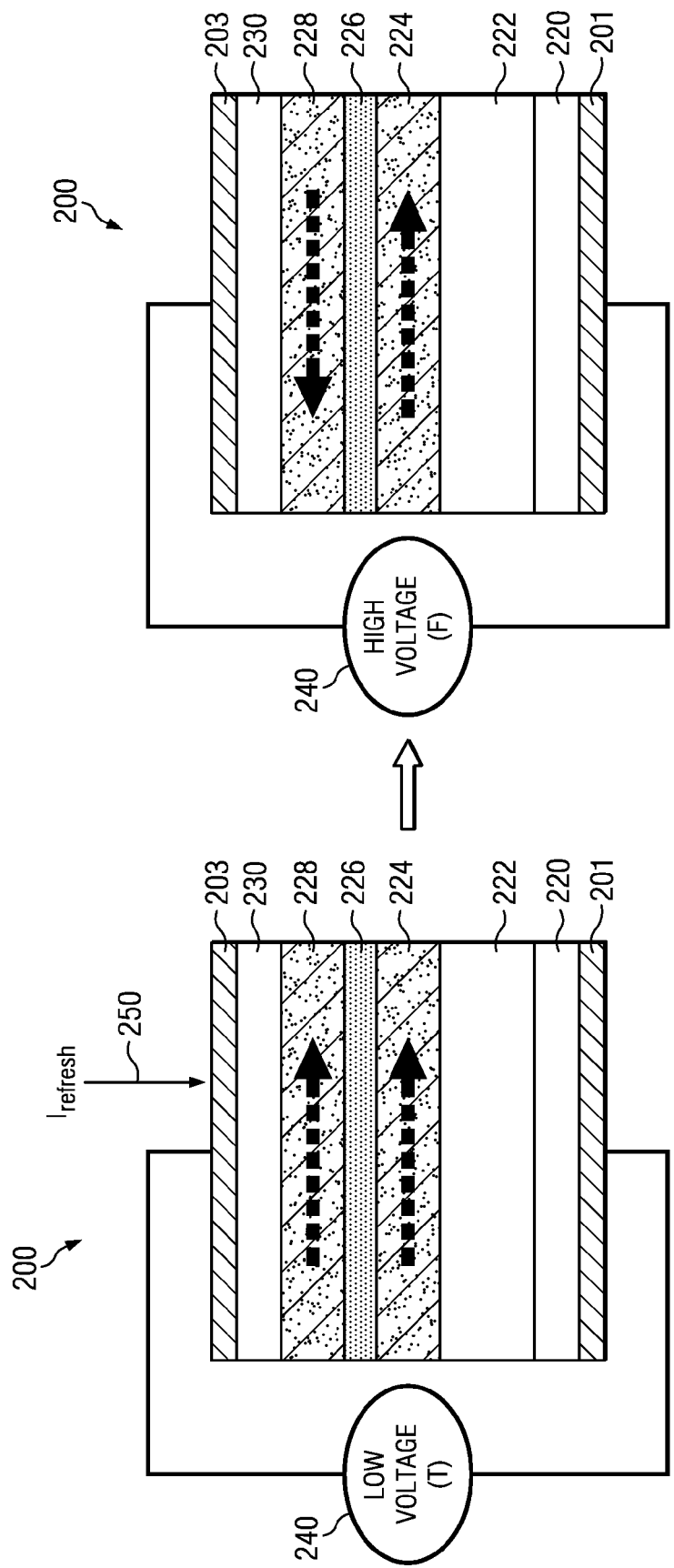

FIGS. 5A and 5B illustrate a refresh process of device 200 in accordance with an embodiment of the present disclosure. FIG. 5A illustrates a refresh current $I_{refresh}$ applied to the top electrode 203 when the magnetization alignment between the bottom and top magnetic layers 224, 228 is antiparallel. The refresh current is greater than a critical current $I_c'$ required to switch the magnetization direction of the top magnetic layer 228. In this case, the refresh current is a reverse electron flow from the free top magnetic layer 228 and causes the magnetization alignment of the bottom and top magnetic layers to remain antiparallel.

FIG. 5B illustrates a refresh current $I_{refresh}$ applied to the top electrode 203 when the magnetization alignment between the bottom and top magnetic layers 224, 228 is parallel. The refresh current is greater than a critical current $I_c'$ required to switch the magnetization direction of the top magnetic layer 228. In this case, the refresh current is a reverse electron flow from the free top magnetic layer 228, and the refresh current switches the magnetization direction of top magnetic layer 228 to refresh the magnetization alignment of the bottom and top magnetic layers to an initial state of antiparallel.

Advantageously, the present disclosure provides for a magnetic logic gate having improved speed (e.g., reversal or switching time less than 50 picoseconds) and power consumption (e.g., less than about 1 picojoule).

Thus, the present disclosure provides for various embodiments. In one embodiment, a magnetic logic device is provided. The device includes a bottom electrode configured to receive a first input current and a second input current, a bottom magnetic layer disposed over the bottom electrode, a nonmagnetic layer disposed over the bottom magnetic layer, a top magnetic layer disposed over the nonmagnetic layer, and a top electrode disposed over the top magnetic layer, the top electrode and the bottom electrode configured to provide an output voltage which is dependent on the first and second input currents and which follows an AND gate logic or an OR gate logic.

In another embodiment, a magnetic logic device includes a bottom electrode configured to receive a first input current and a second input current, a bottom buffer layer disposed over the bottom electrode, an antimagnetic layer disposed over the bottom buffer layer, a fixed bottom ferromagnetic layer disposed over the antimagnetic layer, a nonmagnetic layer disposed over the bottom ferromagnetic layer, and a free top ferromagnetic layer disposed over the nonmagnetic layer, wherein an initial magnetization alignment of the bottom and top ferromagnetic layers is antiparallel. The device further includes a top buffer layer disposed over the top ferromagnetic layer, and a top electrode disposed over the top buffer layer, wherein the top electrode is configured to receive a refresh current greater than a critical current required to switch a magnetization direction of the top ferromagnetic layer, and wherein the top electrode and the bottom electrode are configured to provide an output voltage which is dependent on the first and second input currents and which follows an AND gate logic or an OR gate logic.

In yet another embodiment, a method of operating a magnetic logic device is provided. The method includes providing a magnetic logic device having a bottom electrode, a bottom magnetic layer disposed over the bottom electrode, a nonmagnetic layer disposed over the bottom magnetic layer, a top magnetic layer disposed over the nonmagnetic layer, and a top electrode disposed over the top magnetic layer. The method further includes applying a first input current and a second input current to the bottom electrode, and providing an output voltage between the top electrode and the bottom electrode which is dependent on the first and second input currents and which follows an AND gate logic or an OR gate logic.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A magnetic logic device, comprising:
   a bottom electrode configured to receive a first input current and a second input current;
   an antimagnetic layer disposed over the bottom electrode;

a bottom magnetic layer disposed over the antimagnetic layer;

a nonmagnetic layer disposed over the bottom magnetic layer;

a top magnetic layer disposed over the nonmagnetic layer; and a top electrode disposed over the top magnetic layer, the top electrode and the bottom electrode configured to provide an output voltage which is dependent on the first and second input currents and which follows an AND gate logic or an OR gate logic.

2. The device of claim 1, wherein the bottom electrode includes a first input current lead, a second input current lead, and a bottom voltage lead, and wherein the top electrode includes an output current lead and a top voltage lead.

3. The device of claim 1, wherein an initial magnetization alignment of the bottom and top magnetic layers is antiparallel, and further wherein the output voltage is dependent on the magnetization alignment of the bottom and top magnetic layers.

4. The device of claim 3, wherein the output voltage is a first binary level when the first and second input currents are each 0 or less than half a critical current required to switch the magnetization direction of the top magnetic layer, and when the magnetization alignment of the bottom and top magnetic layers is antiparallel.

5. The device of claim 3, wherein the output voltage is a first binary level when the first input current is between a critical current required to switch the magnetization direction of the top magnetic layer and half the critical current, when the second input current is 0 or less than half the critical current, and when the magnetization alignment of the bottom and top magnetic layers is antiparallel.

6. The device of claim 3, wherein the output voltage is a first binary level when the first input current is 0 or less than half a critical current required to switch the magnetization direction of the top magnetic layer, when the second input current is between the critical current and half the critical current, and when the magnetization alignment of the bottom and top magnetic layers is antiparallel.

7. The device of claim 3, wherein the output voltage is a second binary level when the first and second input currents are each between a critical current required to switch the magnetization direction of the top magnetic layer and half the critical current, and when the magnetization alignment of the bottom and top magnetic layers is parallel.

8. The device of claim 3, wherein the output voltage is a first binary level when the first and second input currents are each 0 or less than a critical current required to switch the magnetization direction of the top magnetic layer, and when the magnetization alignment of the bottom and top magnetic layers is antiparallel.

9. The device of claim 3, wherein the output voltage is a second binary level when the first input current is greater than a critical current required to switch the magnetization direction of the top magnetic layer, when the second input current is 0 or less than the critical current, and when the magnetization alignment of the bottom and top magnetic layers is parallel.

10. The device of claim 3, wherein the output voltage is a second binary level when the first input current is 0 or less than a critical current required to switch the magnetization direction of the top magnetic layer, when the second input current is greater than the critical current, and when the magnetization alignment of the bottom and top magnetic layers is parallel.

11. The device of claim 3, wherein the output voltage is a second binary level when the first and second input currents are each greater than a critical current required to switch the magnetization direction of the top magnetic layer, and when the magnetization alignment of the bottom and top magnetic layers is parallel.

12. The device of claim 1, wherein the top electrode is configured to receive a refresh current greater than a critical current required to switch the magnetization direction of the top magnetic layer, the refresh current causing the magnetization alignment of the bottom and top magnetic layers to be an initial state of antiparallel.

13. The device of claim 1, further comprising:

a bottom buffer layer disposed over the bottom electrode; and a top buffer layer disposed between the top magnetic layer and the top electrode.

14. A magnetic logic device, comprising:

a bottom electrode configured to receive a first input current and a second input current;

a bottom buffer layer disposed over the bottom electrode;

an antimagnetic layer disposed over the bottom buffer layer;

a fixed bottom ferromagnetic layer disposed over the antimagnetic layer;

a nonmagnetic layer disposed over the bottom ferromagnetic layer;

a free top ferromagnetic layer disposed over the nonmagnetic layer, wherein an initial magnetization alignment of the bottom and top ferromagnetic layers is antiparallel;

a top buffer layer disposed over the top ferromagnetic layer; and a top electrode disposed over the top buffer layer, wherein the top electrode is configured to receive a refresh current greater than a critical current required to switch a magnetization direction of the top ferromagnetic layer, and wherein the top electrode and the bottom electrode are configured to provide an output voltage which is dependent on the first and second input currents and which follows an AND gate logic or an OR gate logic.

15. The device of claim 14, wherein the AND gate logic comprises:

the output voltage is a first binary level when the first and second input currents are each 0 or less than half the critical current, and when the magnetization alignment of the bottom and top ferromagnetic layers is antiparallel;

the output voltage is a first binary level when the first input current is between the critical current and half the critical current, when the second input current is 0 or less than half the critical current, and when the magnetization alignment of the bottom and top ferromagnetic layers is antiparallel;

the output voltage is a first binary level when the first input current is 0 or less than half the critical current, when the second input current is between the critical current and half the critical current, and when the magnetization alignment of the bottom and top ferromagnetic layers is antiparallel; and the output voltage is a second binary level when the first and second input currents are each between the critical current and half the critical current, and when the magnetization alignment of the bottom and top ferromagnetic layers is parallel.

16. The device of claim 14, wherein the OR gate logic comprises:
  the output voltage is a first binary level when the first and second input currents are each 0 or less than the critical current, and when the magnetization alignment of the bottom and top ferromagnetic layers is antiparallel;
  the output voltage is a second binary level when the first input current is greater than the critical current, when the second input current is 0 or less than the critical current, and when the magnetization alignment of the bottom and top ferromagnetic layers is parallel;
  the output voltage is a second binary level when the first input current is 0 or less than the critical current, when the second input current is greater than the critical current, and when the magnetization alignment of the bottom and top ferromagnetic layers is parallel; and
  the output voltage is a second binary level when the first and second input currents are each greater than the critical current, and when the magnetization alignment of the bottom and top ferromagnetic layers is parallel.

17. A method of operating a magnetic logic device, the method comprising:
  providing a magnetic logic device, including:
    a bottom electrode;
    an antimagnetic layer disposed over the bottom electrode;
    a bottom magnetic layer disposed over the antimagnetic layer;
    a nonmagnetic layer disposed over the bottom magnetic layer;
    a top magnetic layer disposed over the nonmagnetic layer; and
    a top electrode disposed over the top magnetic layer;
  applying a first input current and a second input current to the bottom electrode; and
  providing an output voltage between the top electrode and the bottom electrode which is dependent on the first and second input currents and which follows an AND gate logic or an OR gate logic.

18. The method of claim 17, wherein an initial magnetization alignment of the bottom and top magnetic layers is antiparallel, and wherein the AND gate logic comprises:
  the output voltage is a first binary level when the first and second input currents are each 0 or less than half a critical current required to switch a magnetization direction of the top magnetic layer, and when the magnetization alignment of the bottom and top ferromagnetic layers is antiparallel;
  the output voltage is a first binary level when the first input current is between the critical current and half the critical current, when the second input current is 0 or less than half the critical current, and when the magnetization alignment of the bottom and top ferromagnetic layers is antiparallel;
  the output voltage is a first binary level when the first input current is 0 or less than half the critical current, when the second input current is between the critical current and half the critical current, and when the magnetization alignment of the bottom and top ferromagnetic layers is antiparallel; and
  the output voltage is a second binary level when the first and second input currents are each between the critical current and half the critical current, and when the magnetization alignment of the bottom and top ferromagnetic layers is parallel.

19. The method of claim 17, wherein an initial magnetization alignment of the bottom and top magnetic layers is antiparallel, and wherein the OR gate logic comprises:
  the output voltage is a first binary level when the first and second input currents are each 0 or less than a critical current required to switch a magnetization direction of the top magnetic layer, and when the magnetization alignment of the bottom and top ferromagnetic layers is antiparallel;
  the output voltage is a second binary level when the first input current is greater than the critical current, when the second input current is 0 or less than the critical current, and when the magnetization alignment of the bottom and top ferromagnetic layers is parallel;
  the output voltage is a second binary level when the first input current is 0 or less than the critical current, when the second input current is greater than the critical current, and when the magnetization alignment of the bottom and top ferromagnetic layers is parallel; and
  the output voltage is a second binary level when the first and second input currents are each greater than the critical current, and when the magnetization alignment of the bottom and top ferromagnetic layers is parallel.

20. The method of claim 17, further comprising applying a refresh current to the top electrode, the refresh current being greater than a critical current required to switch the magnetization direction of the top magnetic layer, and the refresh current causing the magnetization alignment of the bottom and top magnetic layers to be an initial state of antiparallel.

\* \* \* \* \*